United States Patent
Ziermann et al.

(10) Patent No.: US 11,226,249 B2
(45) Date of Patent: Jan. 18, 2022

(54) PRESSURE MEASURING DEVICE HAVING A FOOTPRINT OF A FIRST JOINT AREA OF A SUPPORT BODY

(71) Applicant: Endress+Hauser SE+Co. KG, Maulburg (DE)

(72) Inventors: Rene Ziermann, Kleinmachnow (DE); Daniel Sixtensson, Potsdam (DE); Dennis Müller, Groß Kreutz OT (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 78 days.

(21) Appl. No.: 16/766,407

(22) PCT Filed: Oct. 24, 2018

(86) PCT No.: PCT/EP2018/079081
§ 371 (c)(1),
(2) Date: May 22, 2020

(87) PCT Pub. No.: WO2019/101455
PCT Pub. Date: May 31, 2019

(65) Prior Publication Data
US 2020/0378850 A1    Dec. 3, 2020

(30) Foreign Application Priority Data
Nov. 23, 2017 (DE) ...................... 10 2017 127 704.8

(51) Int. Cl.
*G01L 9/00* (2006.01)

(52) U.S. Cl.
CPC .................................. *G01L 9/0055* (2013.01)

(58) Field of Classification Search
None
See application file for complete search history.

(56) References Cited

U.S. PATENT DOCUMENTS

| 4,800,758 A | 1/1989 | Knecht et al. |
| 7,661,318 B2 * | 2/2010 | Brosh ................... G01L 19/146 73/715 |

(Continued)

FOREIGN PATENT DOCUMENTS

| CN | 102257372 A | 11/2011 |
| CN | 107003196 A | 8/2017 |

(Continued)

*Primary Examiner* — Andre J Allen
*Assistant Examiner* — Jermaine L Jenkins
(74) *Attorney, Agent, or Firm* — Christopher R. Powers; Endress+Hauser (USA) Holding Inc.

(57) ABSTRACT

Disclosed is a pressure measuring device, whose pressure sensor is protected against thermomechanical stresses, comprising a carrier, a support body arranged on the carrier, a pressure sensor arranged on the support body, a first joint including a joint material connecting the support body with the pressure sensor, and a second joint including a joint material connecting the support body with the carrier. The support body has on a face opposite the pressure sensor a first groove configured such that the first groove surrounds a joint area of the support body. The joint area of the support body and a footprint of the first joint are essentially equally large and significantly less than a base area of the pressure sensor opposite the first joint.

17 Claims, 3 Drawing Sheets

(56) References Cited

U.S. PATENT DOCUMENTS

2002/0185715 A1    12/2002  Honer et al.
2017/0334713 A1*  11/2017  Golden ................ G01L 13/025
2017/0350783 A1*  12/2017  Sixtensson ............ G01L 19/146
2019/0119103 A1*   4/2019  Guilardi .............. B81C 1/00309

FOREIGN PATENT DOCUMENTS

| | | |
|---|---|---|
| CN | 107110729 A | 8/2017 |
| DE | 3436440 A1 | 4/1986 |
| DE | 102007052364 A1 | 5/2009 |
| DE | 102007053859 A1 | 5/2009 |
| DE | 102009046692 A1 | 5/2011 |
| DE | 102014119396 A1 | 6/2016 |
| DE | 102015117736 A1 | 4/2017 |
| DE | 102016107856 A1 | 11/2017 |
| WO | 2018033348 A1 | 2/2018 |

* cited by examiner

PRESSURE MEASURING DEVICE HAVING A FOOTPRINT OF A FIRST JOINT AREA OF A SUPPORT BODY

CROSS-REFERENCE TO RELATED APPLICATIONS

The present application is related to and claims the priority benefit of German Patent Application No. 10 2017 127 704.8, filed on Nov. 23, 2017 and International Patent Application No. PCT/EP2018/079081, filed on Oct. 24, 2018, the entire contents of which are incorporated herein by reference.

TECHNICAL FIELD

The invention relates to a pressure measuring device comprising a carrier, a support body arranged on the carrier, a pressure sensor arranged on the support body, a first joint comprising a joint material connecting the support body with the pressure sensor and a second joint comprising a joint material connecting the support body with the carrier.

BACKGROUND

Pressure measuring devices serve for metrological registering of pressures, especially absolute pressures, relative pressures and pressure differences, and are used in industrial measurements technology.

In pressure measuring technology, so called semiconductor pressure sensors are frequently applied. Semiconductor sensors are, in the present state of the art, regularly produced using silicon, e.g., by applying Silicon on Insulator (SOI) technology. They are embodied, e.g., as pressure sensor chips, which typically comprise a platform and a measuring membrane arranged on the platform.

These pressure sensors are very sensitive and are therefore, as a rule, deployed in a metal housing and supplied with the pressure to be measured via an interposed pressure transfer means filled with a pressure transfer liquid. Housing and pressure sensor are made of materials, which have very different coefficients of thermal expansion. Due to the mechanical connection between housing and pressure sensor required for the sensor mounting, thermomechanical stresses can occur, which affect the transfer behavior of the measuring membrane and therewith degrade the achievable accuracy of measurement and its reproducibility. This is true especially for a temperature dependent hysteresis of the measurement results.

For reducing temperature dependent stresses acting on the pressure sensor, DE 102007052364 A1 describes arranging the pressure sensor chip on a ceramic intermediate layer, which has a coefficient of thermal expansion adapted to the coefficient of thermal expansion of the semiconductor material of the pressure sensor. The intermediate layer is adhered directly to a metal carrier of the housing via an adhesive bond based on an elastic adhesive. Given as material of the carrier is Kovar. Kovar has a coefficient of thermal expansion of 6 ppm/K and lies therewith significantly nearer to the coefficient of thermal expansion of silicon of 2.6 ppm/K applied for pressure sensors than more common and significantly more cost-effective housing materials, such as, e.g., stainless steel with a coefficient of thermal expansion of 16 ppm/K.

In the case of the described pressure measuring device, the ceramic intermediate layer has a footprint, which is larger than the footprint of the pressure sensor arranged thereon. This has the result that, despite the comparatively well adapted coefficient of thermal expansion of the intermediate layer, thermomechanical stresses do act on the pressure sensor over the entire base area of the pressure sensor.

As an alternative to this, approaches are known in the state of the art, in which a reduction of temperature dependent stresses acting on the pressure sensor is achieved by arranging the pressure sensor on a free end of a pedestal, whose footprint is significantly less than the footprint of the pressure sensor mounted thereon.

Thus, e.g. in DE 102014119396 A1, a pressure measuring device is described comprising a carrier, a pedestal arranged on the carrier, a pressure sensor arranged on the pedestal, a first adhesive bond connecting the pedestal with the pressure sensor and a second adhesive bond connecting the pedestal with the carrier. In the case of this pressure measuring device, the pedestal is embodied as separate rod- or tube-shaped component, whose footprint is smaller than the footprint of the pressure sensor mounted thereon, and which is adhered in a recess provided in the carrier.

The smaller the footprint of the rod- or tube-shaped pedestal, the more difficult it is, however, to introduce the adhesive with sufficiently exact metering into the correspondingly small recess. Moreover, the precise orientation of rod or tubular shaped pedestal both in the case of the insertion into the recess, as well as also during the performance of the adhesive bonding, requires more care, the smaller the footprint of the pedestal is compared with its length.

This problem is met, e.g., in the manner described in DE 102015117737 A1, by providing the pressure sensor on a specially formed pedestal. This pedestal includes at the carrier a base with a comparatively large footprint, and adjoining the base with a significantly smaller footprint, a projection on which the pressure sensor is arranged. In such case, the base can have, e.g., on its end toward the carrier an outwardly surrounding recess, which receives excess adhesive.

Moreover, DE 102016107856 A1 describes reducing the thermomechanical coupling between a support body and a pressure sensor mounted on the support body by means of a joint by providing that a layer region of the support body directly adjoining the joint has a three-dimensional surface topography, which is embodied in such a manner that the joint area of the layer region facing the pressure sensor comprises surface portions distributed in a plane over the layer region, wherein the total surface area formed by the sum of the surface portions is less than the footprint of the joint. The surface portions can be mutually separated, for example, by grooves, which are introduced into the layer region by means of laser radiation or by means of an etching method and which have a groove depth of 300 µm to 700 µm and a groove breadth of 10 µm to 100 µm.

Both solutions have, however, the disadvantage that the pedestal, or the support body, as the case may be, are components, which are manufactured as separate parts and which have a comparatively complicated profiling and are, accordingly, complicated, time consuming and expensive to manufacture.

SUMMARY

It is an object of the invention to provide a pressure measuring device, which has a pressure sensor protected against thermomechanical stresses and which can be produced cost effectively.

To this end, the invention resides in a pressure measuring device, comprising:
a carrier,
a support body arranged on the carrier,
a pressure sensor arranged on the support body,
a first joint comprising a joint material connecting the support body with the pressure sensor, and
a second joint comprising a joint material connecting the support body with the carrier,
characterized in that the support body has on a pressure sensor facing face a first groove, which is embodied in such a manner that
the first groove surrounds a pressure sensor facing joint area of the support body externally on all sides,
the joint area of the support body and a footprint of the first joint are essentially equally large and significantly less than a first joint facing base area of the pressure sensor,
the first groove has a breadth, which is greater than or equal to a minimum breadth of 150 µm to 1 mm, and
the first groove a depth has, which is greater than or equal to a minimum depth of 0.3 mm to 2 mm.

The invention offers the advantage that the pressure sensor is protected against thermomechanical stresses by the comparatively small footprint of the first joint, as externally limited by the first groove.

At the same time, the invention offers the advantage that the support body can, in total, because of the grooved limiting of the footprint of the first joint to the size of the joint area surrounded by the groove, have a footprint, which is significantly greater than the footprint of the first joint.

Additionally, the groove offers the advantage that it receives, during the joining method applied for producing the first joint, excess joint material, in given cases, externally escaping from a gap between the joint area of the support body and a base of the pressure sensor lying opposite thereto.

The large (compared to pedestals used in the state of the art) support body of comparatively simple form offers the advantage that it can be produced in simple, cost-effective manner and, because of its size and shape, can be mounted very much more easily on the carrier than an elongated pedestal of smaller footprint.

First further developments of the invention are distinguished by features including that:
an intermediate space arranged between a surface of the support body outwardly surrounding the first groove and the oppositely lying surface of the pressure sensor forms a hollow space, which is free of joint material,
the support body has a footprint, which is greater than or equal to an area of a face of the pressure sensor facing the first joint, and/or
the first joint and/or the second joint are/is embodied as a glass soldering, a soft soldering or an adhesive bond.

Second further developments of the invention are distinguished by features including that:
the pressure sensor has a footprint in the order of magnitude of 1 mm$^2$ to 50 mm$^2$,
the pressure sensor facing joint area of the support body has a size of 0.2 mm$^2$ to 20 mm$^2$,
the carrier is composed of a metal or a stainless steel,
the support body is composed of a material comprising a metal, a stainless steel, Kovar, Invar, a ceramic, aluminum oxide ($Al_2O_3$), silicon carbide (SiC), silicon nitride ($Si_3N_4$), aluminum nitride (AlN), a glass, borosilicate glass, or silicon,
the support body is embodied as an essentially washer or disk-shaped body with circular, rectangular or square footprint and/or
the support body is arranged as a freestanding element directly on the carrier or is inserted as a freestanding element into a hollow in the carrier, and/or
the support body has a height of greater than or equal to 1 mm, wherein the height is also greater than or equal to twice the depth of the first groove.

A third further development of the invention is distinguished by features including that:
the support body has on a carrier facing face a second groove, which surrounds a carrier facing joint area of the support body externally on all sides,
the second joint has a footprint, which essentially equals the joint area surrounded by the second groove,
the second groove has a breadth, which is greater than or equal to a minimum breadth of 150 µm to 1 mm, and
the second groove has a depth, which is greater than or equal to a minimum depth of 0.3 mm to 2 mm.

A fourth further development of the invention is distinguished by features including that:
the support body has on its carrier facing face an outwardly surrounding recess open on an outer lateral surface and on the carrier facing face of the support body,
wherein the recess surrounds the carrier facing joint area of the support body externally on all sides, and
wherein the height of the recess is greater than or equal to a minimum height of 0.3 mm to 2 mm, and/or the breadth of the recess is greater than or equal to a minimum breadth of 150 µm to 1 mm.

A fifth further development of the invention is distinguished by features including that:
the first groove arranged on the pressure sensor facing face of the support body and/or the second groove arranged on the carrier facing face of the support body is embodied in each case as a groove, which is closed to form a ring.

A sixth further development of the invention is distinguished by features including that:
the joint area arranged on the carrier facing face of the support body is greater than or equal to the joint area arranged on the pressure sensor facing face of the support body.

A preferred embodiment of the invention is distinguished by features including that:
the first joint and/or the second joint is embodied in each case as an adhesive bond.

A seventh further development of the invention is distinguished by features including that:
the support body has on its pressure sensor facing face four grooves introduced into the support body and each extending in a straight line from an outer side of the support body to an oppositely lying outer side of the support body, each of which has a groove segment extending in parallel with its one of the outer edges of the joint area and directly adjoining such outer edge, wherein the groove segments are arranged in such a manner that the four groove segments adjoining the outer edges of the joint area form the first groove externally surrounding the joint area on all sides, and/or
the support body has on its carrier facing face four grooves introduced into the support body and each extending in a straight line from an outer side of the support body to an oppositely lying outer side of the support body, each of which has a groove segment extending in parallel with its one of the outer edges of the joint area and directly adjoining such outer edge, wherein the groove segments are arranged in such a manner that the four groove segments adjoining the outer edges of the joint area form the second groove surrounding the joint area externally on all sides.

Moreover, the invention includes a method for manufacturing pressure measuring devices of the invention, which method is distinguished by features including that:

the carriers, support bodies and pressure sensors of the pressure measuring devices are prefabricated, wherein a plurality of support bodies are manufactured in parallel with one another from a starting material in the form of a foil or disk by producing the first grooves, the second grooves and/or the recesses in the individual support bodies, in each case, by means of a working method and the support bodies are then separated by means of a separating method, and pressure measuring devices are manufactured from the prefabricated components by mounting their support bodies on their carriers by means of a joining method performed by means of a joint material and mounting their pressure sensors on their support bodies by means of a joining method performed by means of a joint material.

A further development of the method is distinguished by features including that at least one working method and/or the separating method is a method performed by means of a cutting tool working with laser or ultrasound or by means of a saw.

A further development of the method for manufacturing pressure measuring devices according to the seventh further development is distinguished by features including that the grooves containing the groove segments forming first grooves arranged on the pressure sensor facing face of the support body and/or the grooves containing the groove segments forming second grooves arranged on the carrier facing face of the support body are produced in the starting material, in each case, by saw cuts introduced by means of a saw, wherein the saw cuts extend from one outer side of the starting material to an oppositely lying outer side of the starting material.

A further development of the method for manufacturing pressure measuring devices according to the fourth further development is distinguished by features including that the recesses are produced by saw cuts introduced into the starting material by means of a saw, wherein the saw cuts extend from one outer side of the starting material to an oppositely lying outer side of the starting material.

Another further development of the method is distinguished by features including that each pressure measuring device is formed, in each case, in such a manner that, during the joining method performed for producing the first joint, excess joint material, in given cases, externally escaping from a gap between the joint area of the support body and an oppositely lying surface of the pressure sensor, is accommodated by the first groove surrounding the joint area.

A further development of the method for manufacturing pressure measuring devices, whose support bodies have the second groove or the recess on their carrier facing face, is distinguished by features including that each pressure measuring device is formed in such a manner that excess joint material, in given cases, externally escaping from a gap between the joint area of the support body and an oppositely lying surface of the carrier during the joining method performed for producing the second joint is accommodated by the second groove surrounding the joint area, or by the recess surrounding the joint area.

BRIEF DESCRIPTION OF THE DRAWINGS

The invention and its advantages will now be explained in greater detail based on the figures of the drawing, in which three examples of embodiments are shown. Equal elements are provided in the figures with equal reference characters. In order to be able to show components of very different dimensions, components in the figures are not always shown to scale. The figures of the drawing show as follows.

DETAILED DESCRIPTION

Figure 1:
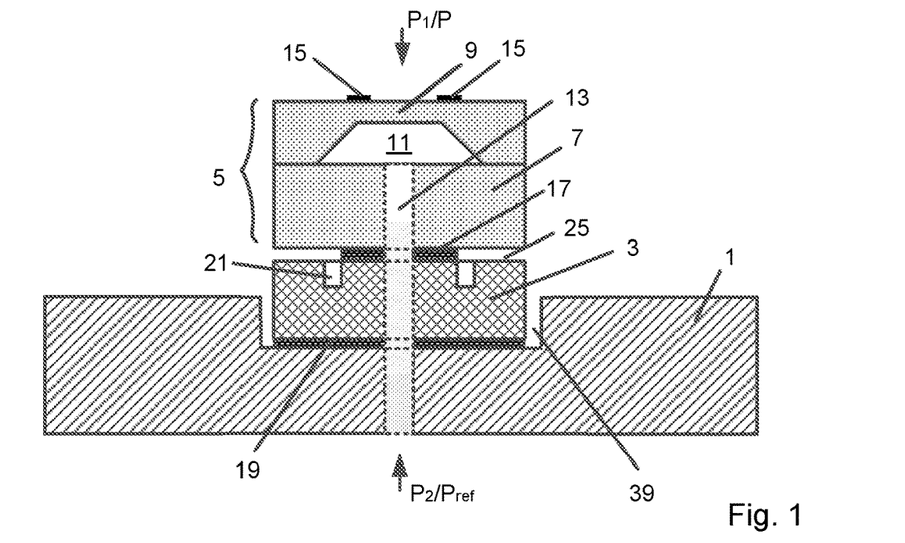
FIGS. 1, 3 and 5 show examples of the pressure measuring device of the present disclosure.
Figure 2:
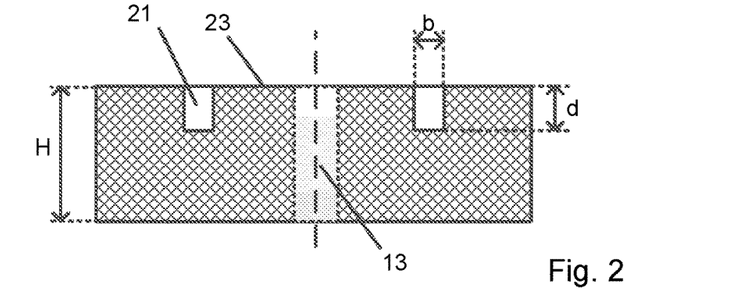
FIG. 2 shows the support body of the pressure measuring device of FIG. 1.

FIG. 1 shows an example of a pressure measuring device of the invention. The pressure measuring device includes a carrier 1, a support body 3 arranged on the carrier 1 and a pressure sensor 5 arranged on the support body 3. FIG. 2 shows an enlarged view of the support body 3 of FIG. 1.

The pressure sensor 5 is, e.g., a semiconductor pressure sensor, e.g., a pressure sensor chip manufactured of silicon. Such includes in the illustrated example a platform 7 and, arranged on the platform 7, a measuring membrane 9, beneath which a pressure chamber 11 is enclosed. Alternatively, instead of the here illustrated pressure sensor 5, naturally a pressure sensor with a construction differing therefrom can also be applied.

The pressure measuring device can be embodied as a pressure difference device, as a relative or gage pressure device, or as an absolute pressure measuring device.

For registering pressure differences, a first face of the measuring membrane 9 is supplied with a first pressure $P_1$ and its second face is supplied with a second pressure $P_2$ via a pressure transfer line 13—shown dashed in FIG. 1—extending through the carrier 1, the support body 3 and the platform 7 and into the pressure chamber 11. In the case of this form of embodiment, the pressure difference to be measured, $\Delta P$, acting on the measuring membrane 9 and resulting from the first and second pressures $P_1$, $P_2$ effects a deflection of the measuring membrane 9 dependent on the pressure difference.

For registering relative pressures, the first face of the measuring membrane 9 is supplied with the pressure P to be measured and the second face of the measuring membrane 9 is fed, instead of the second pressure $P_2$ a reference pressure $P_{ref}$, e.g., an ambient pressure, with reference to which the pressure P acting on the first face is to be measured. In the case of this form of embodiment, the pressure difference acting on the measuring membrane 9 between the pressure P and the reference pressure $P_{ref}$ effects a deflection of the measuring membrane 9 dependent on the relative pressure to be measured.

For registering absolute pressures, the pressure chamber 11 enclosed beneath the measuring membrane 9 is evacuated. In this case, the pressure transfer line 13 is absent and the pressure P acting on the first face of the measuring membrane 9 effects a deflection of the measuring membrane 9 dependent on the absolute pressure to be measured.

The resulting deflection of the measuring membrane 9 is in all three cases registered by means of an electromechanical transducer and converted into an electrical output signal, which then is available for further processing and/or evaluation. Used as transducer can be, e.g., a piezoresistive transducer, which includes sensor elements 15 arranged on or in the measuring membrane 9, e.g., piezoresistive elements connected together to form a resistance measurement bridge.

The support body 3 is connected to the pressure sensor 5 by means of a first joint 17 of a joint material and with the carrier 1 by means of a second joint 19 of a joint material. In such case, the first joint 17 and/or the second joint 19 can, depending on choice of joint material, be embodied, e.g., as a glass solder, as a soft solder or as an adhesive bond. Preferably, at least one of the two joints 17, 19 is an adhesive bond. In an especially preferred form of embodiment, both joints 17, 19 are adhesive bonds. For manufacture of the adhesive bonds, especially suited are adhesives based on epoxy resin, thermoplastic adhesives or silicone adhesives, such as, for example, silicone rubber.

Adhesive bonds offer the advantage that they are significantly more elastic than alternatively usable joints, such as, for example, glass solder or soft solder. They are thus better able to accommodate, or to diminish, stresses occurring because of different coefficients of thermal expansion of carrier 1 and support body 3, or of support body 3 and pressure sensor 5, stresses which otherwise could be transferred to the pressure sensor 5, especially to its measuring membrane 9. Moreover, adhesive bonds permit a large bandwidth of different materials of carrier 1 and support body 3, or of support body 3 and pressure sensor 5, to be connected together.

Independently of the choice of the joining method used for manufacturing the joints 17, 19, the carrier 1 is composed as regards its pressure resistance preferably of a material with a high modulus of elasticity, and as regards its comparatively large volume preferably of a cost-effective material. Suited for this are, especially, metals, e.g., stainless steel.

The material of the support body 3 can, as regards the special requirements for a pressure measuring device, be selected from a number of different materials. For this, to be considered are metals, especially stainless steel, Kovar or Invar, ceramics, especially aluminum oxide ($Al_2O_3$), silicon carbide (SiC), silicon nitride ($Si_3N_4$) or aluminum nitride (AlN), glasses, especially borosilicate glass, and silicon containing materials. In such case, however, the choice of the joining method can, in given cases, present limitations for the selection of the material.

According to the invention, the support body 3 has on its face facing the pressure sensor 5 a groove 21, which surrounds a pressure sensor 5 facing joint area 23 of the support body 3 externally on all sides. Groove 21 is embodied in such a manner that the joint area 23 of the support body 3 and a footprint of the first joint 17 are essentially equally large and significantly less than a base area of the pressure sensor 5 facing toward the first joint 17. For this, the groove 21 has a breadth b, which is greater than or equal to a minimum breadth of 150 µm to 1 mm, and a depth d, which is greater than or equal to a minimum depth of 0.3 mm to 2 mm.

This dimensioning of breadth b and depth d of the groove 21 ensures that the groove 21 limits the footprint of the first joint 17 during the total joining method performed for manufacturing the first joint 17 to the size of the joint area 23 in such a manner that an intermediate space 25 outwardly surrounding the groove 21 and arranged between a surface of the support body 3 and the face of the pressure sensor 5 lying opposite this forms a hollow space, which is free of joint material.

In such case, groove 21 prevents that joint material introduced for manufacturing the first joint 17 into a gap located between the joint area 23 of the support body 3 and the face of the pressure sensor 5 lying opposite this and having become liquid or viscous during the joining method can propagate into the intermediate space 25. At the same time, it is assured by the dimensioning of breadth b and depth d of the groove 21 that the groove 21 is large enough, in given cases, to accommodate excess joint material escaping externally from the gap during the joining method. Groove 21 thus forms during the total joining method a barrier, which cannot be breached by the joint material.

The limiting of the footprint of the joint 17 to the size of the joint area 23 surrounded by the groove 21, as effected, and assured, by the groove 21, offers the advantage that the support body 3 can, as a whole, have a footprint, which is significantly greater than the joint area 23, without thereby enlarging the footprint of the joint 17. Thus, the support body 3 can directly have a footprint, which is greater than or equal to the area of the base of the pressure sensor 5 facing toward the first joint 17. The large (compared with pedestals used in the state of the art), comparatively simply formed, support body 3 offers the advantage that it can be produced in simple, cost-effective manner and can be mounted in simple, cost-effective manner on the carrier 1.

Semiconductor pressure sensors have, regularly, a footprint, whose size, depending on measuring range and measuring sensitivity, lies in the order of magnitude of 1 $mm^2$ to 50 $mm^2$. In the case of pressure sensors 5 with a square footprint, this corresponds to a side length of 1 mm to about 7 mm. In connection with a pressure sensor 5 of this size, the joint area 23 of the support body 3 can, depending on size of the footprint of the pressure sensor 5, have, for example, a size of 0.2 $mm^2$ to 20 $mm^2$. If the joint area 23 is square, this corresponds to a side length of about 0.5 mm to about 4.5 mm.

Both in the case of the pressure measuring device formed as a pressure difference measuring system as well as also in the case of the pressure measuring device formed as a relative pressure measuring device, the joint area 23 is reduced by the cross sectional area of the pressure transfer line 13 extending through the first joint 17.

By the small footprint of the first joint 17 compared with the base area of the pressure sensor 5, a comparatively high-quality of thermomechanical decoupling between pressure sensor 5 and support body 3 is achieved. In such case, the thermomechanical stresses transferable via the first joint 17 to the pressure sensor 5 are lower, the smaller the joint area 23 of the support body 3 is and therewith also the smaller the footprint of the first joint 17 is.

Moreover, the thermomechanical stresses transferable via the first joint 17 to the pressure sensor 5 are lower, the greater a layer thickness of the first joint 17 is and the more elastic the first joint 17 is. The greater the layer thickness of the first joint 17, naturally also the greater the breadth b and depth d of the groove 21 should be dimensioned, in order safely to assure that the groove 21 can, in given cases, completely accommodate excess joint material escaping from the gap.

Figure 3:
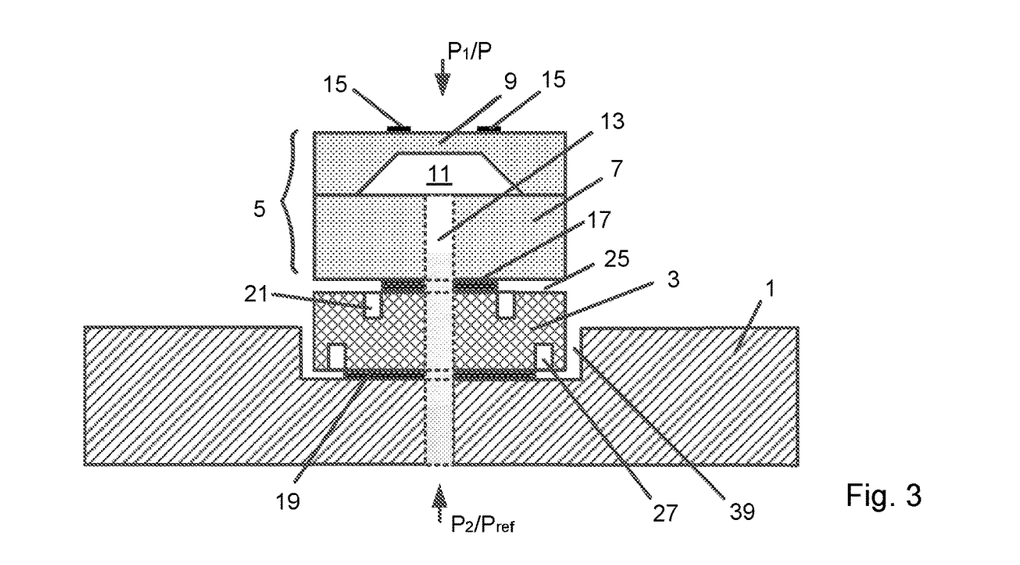
Figure 4:
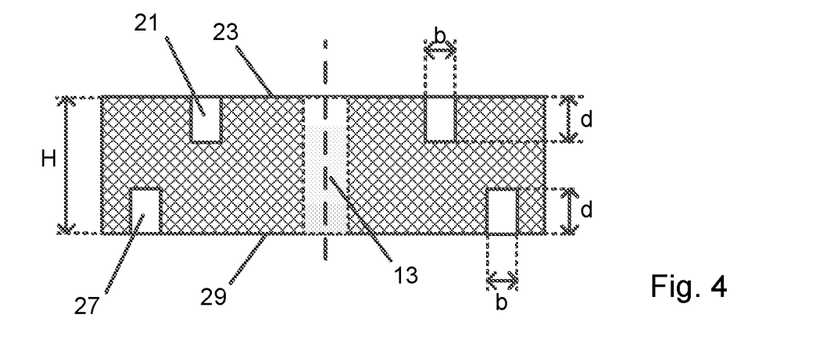
FIG. 4 shows the support body of the pressure measuring device of FIG. 3.

Optionally, the support body 3 can have on its face facing carrier 1 a second groove 27, which surrounds a carrier 1 facing joint area 29 of the support body 3 externally on all sides. FIG. 3 shows an example of a pressure measuring device equipped with such a support body 3, and FIG. 4 shows the support body 3 of FIG. 3. The above explanations for breadth b and depth d of the groove 21 arranged in the pressure sensor 5 facing face hold correspondingly for the second groove 27 facing the carrier 1.

The second groove 27 effects a limiting of the footprint of the second joint 19 connecting the support body 3 with the carrier 1 to an area, which is significantly less than the base area of the support body 3. In this way, a reduction of the thermomechanical coupling between carrier 1 and support body 3 is achieved, which, in turn, effects an improvement of the protection of the pressure sensor 5 against thermomechanical stresses exerted thereon.

Since the second joint 19 connecting the carrier 1 with the support body 3 is spaced from the pressure sensor 5 by the height H of the support body 3 and, because of this, is only in significantly lesser measure also responsible for thermomechanical stresses exerted on the pressure sensor 5, the joint area 29 arranged on the carrier 1 facing face of the support body 3 and surrounded by the second groove 27 can directly have a size, which is greater than or equal to the joint area 23 arranged on the pressure sensor 5 facing face of the support body 3.

Figure 5:
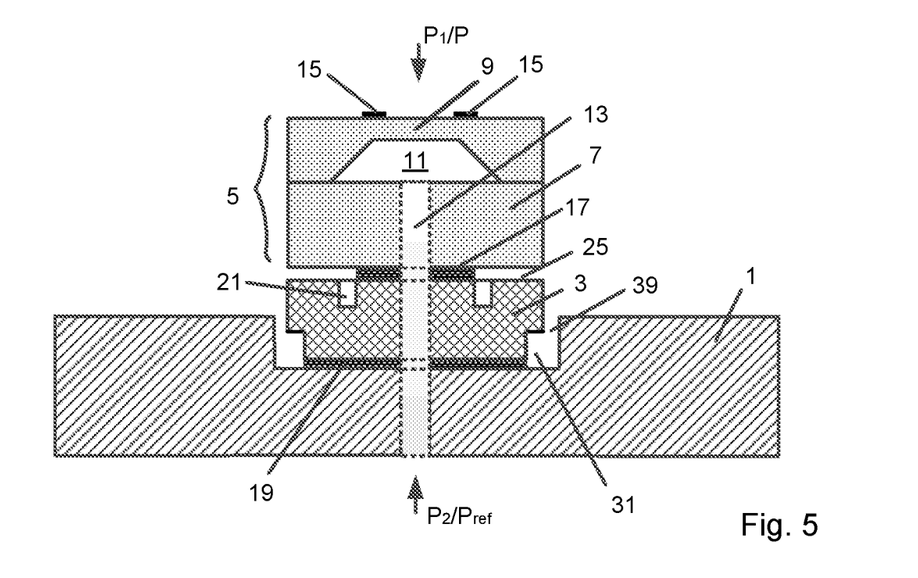
Figure 6:
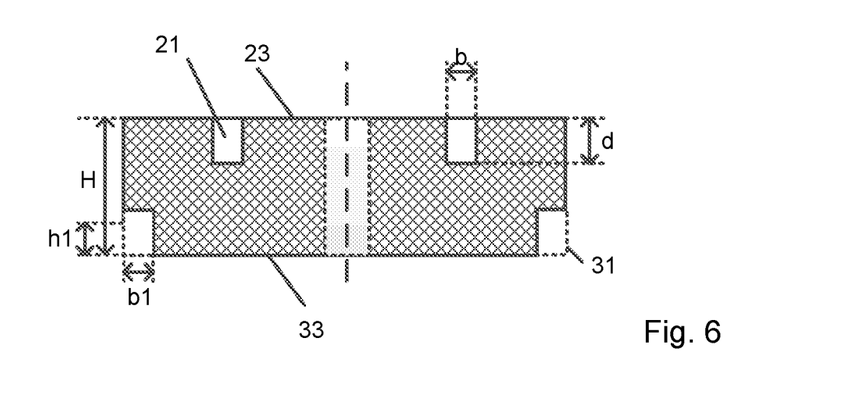
FIG. 6 shows the support body of the pressure measuring device of FIG. 5.

Alternatively, the footprint of the second joint 19 connecting the support body 3 with the carrier 1 can optionally also be limited by providing the support body 3 on its face facing the carrier 3 with an outwardly surrounding recess 31 open on an outer lateral surface and on the face facing the carrier 1 and surrounding the carrier 1 facing joint area 33 of the support body 3 externally on all sides. FIG. 5 shows an example of a pressure measuring device equipped with such a support body 3, and FIG. 6 shows the support body 3 of FIG. 5.

In such case, the recess 31 has preferably a height h1, which is greater than or equal to a minimum height of 0.3 mm to 2 mm. Alternatively or additionally, it has preferably a breadth b1, which is greater than or equal to a minimum breadth of 150 μm to 1 mm.

The support bodies 3 illustrated as examples in FIGS. 1 to 6 can be embodied, e.g., as essentially washer-shaped bodies with circular, rectangular or square footprint, into whose pressure sensor 5 facing face the first groove 21 is introduced.

The first groove 21 can be embodied, e.g., as a ring-shaped groove 21. Thus, the first groove 21 can be embodied, e.g., in plan view, as an elliptical, circular, tetragon shaped, especially diamond shaped, rectangular or square ring, which surrounds the accordingly elliptical, circular, tetragon shaped, especially diamond shaped, rectangular or square joint area 23 externally on all sides.

Figure 7:
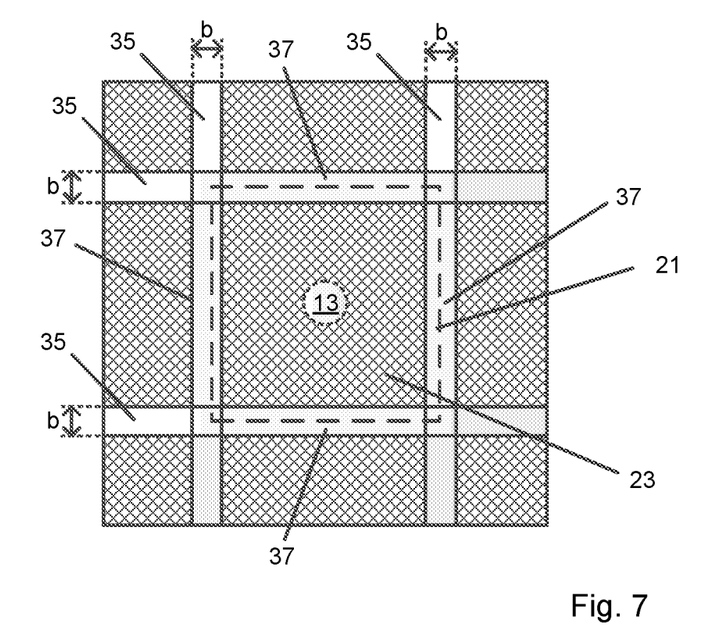
FIG. 7 shows a plan view of a face facing the pressure sensor of one of the support bodies of FIGS. 1 to 6.

If the joint area 23 is embodied as a tetragon shaped joint area 23 having four outer edges, then the support body 3 can alternatively also have on its face facing the pressure sensor 5 four grooves 35 introduced into the support body 3, and, in each case, extending in a straight line fashion from an outer side of the support body 3 to an opposite outer side of the support body 3 across the total support body 3, with each groove 35 having a groove segment 37 extending in parallel with one of the outer edges of the joint area 23 and directly adjoining such outer edge. FIG. 7 shows a plan view of the pressure sensor 5 facing face of such a support body 3. There, the four groove segments 37 adjoining the outer edges of the joint area 23 form together the groove 21 outwardly surrounding the joint area 23 on all sides, as shown in FIG. 7 by the dashed lines.

Naturally also the, in given cases present, second groove 27 and the joint area 29 externally surrounded by this can, in this way, be analogously embodied.

Alternatively or supplementally, the support body 3 can be arranged as a freestanding element on the carrier 1. This offers the advantage that thermomechanical stresses attributable to the different coefficients of thermal expansion of carrier 1 and support body 3 can be dissipated over the entire height H of the support body 3. Thus, support body 3 has preferably a height H of greater than or equal to 1 mm, wherein the height H at the same time is greater than or equal to twice the depth d of the first groove 21.

The support body 3 can be arranged directly on a planar outer end face of the carrier 1. Alternatively, the carrier 1 can have on its pressure sensor 5 facing face a hollow 39, into which the support body 3 is inserted as a freestanding element. This variant shown in FIGS. 1, 3 and 5 by way of example offers the advantage of an, as a whole, lower and more compact form of construction, by which, among other things, it is achieved that an interior of a housing (not shown), into which the pressure sensor 5 on the carrier 1 is introduced, can be significantly smaller. In this way, the volume of the pressure transfer liquid lessens, via which the outside of the measuring membrane 9 is supplied in the interior of the housing with the pressure P to be measured, or with the first pressure $P_1$ to be measured, as the case may be.

Pressure measuring devices of the invention are preferably produced by, firstly, prefabricating the carrier 1, the support body 3 and the pressure sensor 5.

The manufacture of the support body 3 is preferably conducted in such a manner that a plurality of support bodies 3 are manufactured in parallel with one another from a starting material in the form of a foil or disk.

For this, the first grooves 21, as well as, in given cases, the second grooves 27, or the recesses 31, of the individual support bodies 3 are produced by means of a working method and the support bodies 3 are then separated from one another by means of a separating method.

Suited as working methods and/or as separating methods are methods embodied e.g. by means of a laser, or ultrasound, based cutting tool. With these tools, the grooves 21, as well as the, in given cases present, second grooves 27 or the, in given cases present, recesses 31, can be produced with almost any form and support bodies 3 with almost any footprint separated from the starting material. With these methods, also the traversing pressure transfer lines 13 extending through the support bodies 3 can be supplementally produced in the support bodies 3 for relative- or pressure difference measuring systems.

For manufacturing first grooves 21 and/or second grooves 27, each surrounding tetragon-shaped joint area 23, and 29, as the case may be, alternatively a working method can be used, in which the grooves 35 containing groove segments 37 forming the grooves 21, 27 and extending in parallel with the outer edges of the joining surfaces 23, 29 are produced by saw cuts introduced into the starting material by means of a saw, saw cuts which extend from one edge of the starting material to an opposite edge of the starting material. This working method offers, compared with alternatively applicable working methods embodied by means of a cutting tool working with laser or ultrasound, the advantage that the grooves 21, 27 surrounding the joining surfaces 23, 29 can be produced in a greater number of support bodies 3 very much faster and more cost-effectively.

Analogously, also for manufacturing recesses 31, each of which surrounds a tetragon-shaped joint area 33, a working method can be used, in which the recesses 31 are produced by saw cuts introduced by means of a saw into the starting material, wherein the saw cuts extend from one edge of the starting material to an opposite edge of the starting material. This offers the advantage that the recesses 31 can be produced in a greater number of support bodies 3 very much faster and more cost effectively Next, the support bodies 3 produced in the starting material are separated. In the case of manufacture of support bodies 3 having the recesses 31, naturally, only the remaining height H of the support body 3 minus height h1 of the recess 31 needs to still be removed.

For separating support bodies 3 with tetragon shape, e.g., support bodies 3 with rectangular or square footprint, instead of a separating method embodied by means of a cutting tool working with laser or ultrasound, alternatively a separating method can be used, in which the support bodies 3 are separated by sawing along their outer edges. This offers the advantage that the separating of a plurality of support bodies 3 can be accomplished faster and more cost-effectively than would be the case using cutting tools working by means of laser or ultrasound, where each support body 3 needs to be individually released from the starting material.

Then, pressure measuring devices are manufactured from the prefabricated components by mounting their support bodies 3 on their carriers 1 by means of a joining method and their pressure sensors 5 on their support bodies 3 by means of a joining method. For this, joining methods known from microsystem technology that employ a joint material can be used, e.g. soft soldering methods, glass soldering methods or adhesive bonding methods.

In such case, during the joining method embodied for producing the first joint 17, excess joint material, in given cases, externally escaping from the gap between pressure sensor 5 and support body 3 is accommodated by the groove 21 surrounding the joint area 23.

Analogously in the case of manufacture of pressure measuring devices, whose support bodies 3 have on their carrier 1 facing face the second groove 27 or the recess 31, during the joining method embodied for producing the second joint 19, excess joint material, in given cases, externally escaping from the gap enclosed between the carrier 1 facing joint area 29 of the support body 3 and the carrier 1 is accommodated by the groove 27 surrounding the joint area 23, or the recess 31 surrounding the joint area 23.

The invention claimed is:

1. A pressure measuring device, comprising
a carrier;
a support body disposed on the carrier;
a pressure sensor disposed on the support body;
a first joint including a first joint material connecting the support body with the pressure sensor; and
a second joint including a second joint material connecting the support body with the carrier, wherein:
the support body includes a face adjacent the pressure sensor, the face including a first groove therein configured such that the first groove surrounds a first joint area of the support body;
the first joint area of the support body and a footprint of the first joint are substantially equal and significantly less than a base area of the pressure sensor adjacent the first joint;
the first groove has a breadth greater than or equal to a minimum breadth of 150 µm to 1 mm; and
the first groove has a depth greater than or equal to a minimum depth of 0.3 mm to 2 mm.

2. The pressure measuring device of claim 1, wherein:
an intermediate space disposed between a surface of the support body outwardly surrounding the first groove and an opposing surface of the pressure sensor defines a hollow space that is free of joint material;
the support body has a footprint that is greater than or equal to an area of a face of the pressure sensor adjacent the first joint; and/or
the first joint and/or the second joint is adapted as a glass soldering, a soft soldering or an adhesive bond.

3. The pressure measuring device of claim 2, wherein:
the pressure sensor has a footprint of 1 mm² to 50 mm²;
the first joint area of the support body is 0.2 mm² to 20 mm²;
the carrier comprises a metal;
the support body is of a material comprising a metal, a stainless steel, Kovar, Invar, a ceramic, aluminum oxide ($Al_2O_3$), silicon carbide (SiC), silicon nitride ($Si_3N_4$), aluminum nitride (AlN), a glass, borosilicate glass or silicon;
the support body is configured as an essentially disk-shaped body with circular, rectangular or square footprint; and/or
the support body is disposed as a freestanding element directly on the carrier or is inserted as a freestanding element into a hollow in the carrier; and/or
the support body has a height greater than or equal to 1 mm, wherein the height is greater than or equal to twice the depth of the first groove.

4. The pressure measuring device of claim 3, wherein:
the support body includes a face adjacent the carrier, the face including a second groove therein that surrounds a second joint area of the support body;
the second joint has a footprint that is essentially equal to the second joint area surrounded by the second groove;
the second groove has a breadth greater than or equal to a minimum breadth of 150 µm to 1 mm; and
the second groove has a depth greater than or equal to a minimum depth of 0.3 mm to 2 mm.

5. The pressure measuring device of claim 4, wherein the first groove and/or the second groove is configured as to form a closed a ring.

6. The pressure measuring device of claim 4, wherein the second joint area is greater than or equal to the first joint area.

7. The pressure measuring device of claim 4, wherein:
the support body includes on its face adjacent the pressure sensor four grooves therein, each extending in a straight line from an outer edge of the support body to an opposing outer edge, each including a groove segment extending parallel to an outer edge of the first joint area and directly adjoining such outer edge, wherein the groove segments are arranged such that the four groove segments adjoining the outer edges of the first joint area define the first groove surrounding the first joint area; and/or
the support body includes on its face adjacent the carrier four grooves therein, each extending in a straight line from an outer edge of the support body to an opposing outer edge, each including a groove segment extending parallel to an outer edge of the second joint area and directly adjoining such outer edge, wherein the groove segments are arranged such that the four groove segments adjoining the outer edges of the second joint area define the second groove surrounding the second joint area.

8. A method for manufacturing the pressure measuring device of claim 7, the method comprising:
forming the four grooves containing the groove segments defining the first grooves and/or the second grooves in the starting material, in each case, by saw cuts using a saw, wherein the saw cuts extend from one outer side of the starting material to an opposing outer side of the starting material.

9. The pressure measuring device of claim 8, wherein:
the support body includes a face adjacent the carrier, the face including an outwardly surrounding recess open on an outer lateral surface of the support body and on the face adjacent the carrier;
the recess surrounds a second joint area of the support body in the face adjacent the carrier; and
the recess has a height greater than or equal to a minimum height of 0.3 mm to 2 mm, and/or the recess has a breadth greater than or equal to a minimum breadth of 150 µm to 1 mm.

10. A method for manufacturing the pressure measuring device of claim 9, the method comprising:
forming the recess by saw cuts into a starting material using a saw, wherein the saw cuts extend from one outer side of the starting material to an opposing outer side of the starting material.

11. A method for manufacturing the pressure measuring device of claim 9, wherein the pressure measuring device is assembled such that, during the joining method producing the second joint, excess joint material that externally escapes from a gap between the second joint area of the support body and an opposing surface of the carrier is accommodated by the second groove surrounding the second joint area or by the recess surrounding the second joint area.

12. The pressure measuring device of claim 1, wherein the first joint and/or the second joint is an adhesive bond.

13. The pressure measuring device of claim 1, wherein the first joint material is the same as the second joint material.

14. A method for manufacturing the pressure measuring device of claim 1, the method comprising:
prefabricating the carrier, the support body and the pressure sensor, wherein a plurality of support bodies are fabricated in parallel with one another from a starting material in the form of a foil or disk, wherein for each of the plurality of support bodies the first groove is formed using a working method, and wherein the plurality of support bodies are then separated using a separating method; and
assembling the pressure measuring device from the prefabricated carrier, support body and pressure sensor by affixing the support body on the carrier by a joining method performed using the second joint material and affixing the pressure sensor to the support body by the joining method performed using the first joint material.

15. The method of claim 14, wherein the working method and/or the separating method is performed using a cutting tool that employs a laser or ultrasound or using a saw.

16. The method of claim 14, wherein the pressure measuring device is assembled such that, during the joining method producing the first joint, excess joint material that externally escapes from a gap between the first joint area of the support body and an opposing surface of the pressure sensor is accommodated by the first groove surrounding the first joint area.

17. A method for manufacturing the pressure measuring device of claim 4, the method comprising:
prefabricating the carrier, the support body and the pressure sensor, wherein a plurality of support bodies are fabricated in parallel with one another from a starting material in the form of a foil or disk, wherein for each of the plurality of support bodies the first groove and second groove are formed using a working method, and wherein the plurality of support bodies are then separated using a separating method; and
assembling the pressure measuring device from the prefabricated carrier, support body and pressure sensor by affixing the support body on the carrier by a joining method performed using the second joint material and affixing the pressure sensor to the support body by the joining method performed using the first joint material.

\* \* \* \* \*